US011636808B2

(12) United States Patent
Yonebayashi

(10) Patent No.: US 11,636,808 B2
(45) Date of Patent: Apr. 25, 2023

(54) DISPLAY DEVICE

(71) Applicant: SHARP KABUSHIKI KAISHA, Sakai (JP)

(72) Inventor: Ryo Yonebayashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/626,354

(22) PCT Filed: Aug. 9, 2019

(86) PCT No.: PCT/JP2019/031660
§ 371 (c)(1),
(2) Date: Jan. 11, 2022

(87) PCT Pub. No.: WO2021/028973
PCT Pub. Date: Feb. 18, 2021

(65) Prior Publication Data
US 2022/0319428 A1 Oct. 6, 2022

(51) Int. Cl.
*G09G 3/3241* (2016.01)
*H01L 27/32* (2006.01)
(52) U.S. Cl.
CPC ....... *G09G 3/3241* (2013.01); *H01L 27/3276* (2013.01); *G09G 2300/0426* (2013.01); *G09G 2300/0819* (2013.01); *G09G 2300/0842* (2013.01); *G09G 2320/0223* (2013.01); *G09G 2320/0233* (2013.01); *G09G 2330/02* (2013.01); *G09G 2330/08* (2013.01)

(58) Field of Classification Search
None
See application file for complete search history.

(56) References Cited

U.S. PATENT DOCUMENTS

2006/0028408 A1 2/2006 Kim
2021/0288129 A1* 9/2021 Okabe ................. H01L 27/3276

FOREIGN PATENT DOCUMENTS

JP 2006-018277 A 1/2006

* cited by examiner

*Primary Examiner* — Nicholas J Lee
(74) *Attorney, Agent, or Firm* — ScienBiziP, P.C.

(57) ABSTRACT

A display device includes: a display region; and a frame region disposed around the display region. The frame region partly includes a terminal section, wherein the frame region includes a main-power-source-voltage stem wire and an auxiliary-power-source-voltage stem wire. The frame region includes a first frame region having the terminal section, and a second frame region located opposite the first frame region with reference to the display region. The main-power-source-voltage stem wire has a potential different from a potential of the auxiliary-power-source-voltage stem wire, and the main-power-source-voltage stem wire and the auxiliary-power-source-voltage stem wire are electrically connected together.

20 Claims, 10 Drawing Sheets

DISPLAY DEVICE

TECHNICAL FIELD

The disclosure relates to a display device.

BACKGROUND ART

An organic-light-emitting-diode (OLED) display with an IR drop occurring in its power source voltage causes variations in the power source voltage in the plane of the display region, thus causing the display region to have brightness unevenness in its plane. This degrades the display quality of the OLED display device.

For a conventional OLED display, studies have been made about, for instance, devising the scheme of pixel circuits to prevent adverse impacts on the display quality resulting from an IR drop in the power source voltage. Unfortunately, it is insufficient to only prevent an IR drop, which occurs in the power source voltage of an OLED display device, from adversely affecting the display quality; a technique of preventing an IR drop per se is desired.

Patent Literature 1 discloses forming power source lines with potentials different from each other, and causing one of the power source lines to compensate for a voltage drop in the other power source line.

CITATION LIST

Patent Literature

Patent Literature 1: Japanese Patent Application Laid-Open No. 2006-18277 (published on Jan. 19, 2006)

SUMMARY

Technical Problem

An OLED display typically supplies power source voltage from its terminal section to electrodes and/or power-source voltage lines. The inventors of the disclosure have found that such an IR drop can occur conspicuously far away from the terminal section. Patent Literature 1 has not found out this fact and provides no countermeasures against such an IR drop.

It is an object of one aspect of the disclosure to achieve a display device that prevents an IR drop in its power source voltage.

Solution to Problem

A display device according to one aspect of the disclosure includes a display region and a frame region disposed around the display region. The frame region partly includes a terminal section. The display region includes the following: display elements that perform display; pixel circuits that drive the display elements; and a plurality of power-source voltage lines that apply a power source voltage having a first potential to the display elements. Each of the display elements includes a first electrode and a function layer. The display region is shared among the function layers. The display device also includes a second electrode that applies, to the display elements, a power source voltage having a second potential different from the first potential. The frame region includes a main-power-source-voltage stem wire and an auxiliary-power-source-voltage stem wire both provided for applying, to the display elements, the power source voltage having the first potential or the power source voltage having the second potential. The frame region includes a first frame region having the terminal section, and a second frame region located opposite the first frame region with reference to the display region. The main-power-source-voltage stem wire has a potential different from the potential of the auxiliary-power-source-voltage stem wire. The main-power-source-voltage stem wire disposed in the second frame region of the frame region and the auxiliary-power-source-voltage stem wire disposed in the second frame region of the frame region are electrically connected together via a switching transistor disposed in the second frame region.

Advantageous Effect of Disclosure

The aspect of the disclosure achieves a display device that prevents an IR drop in its power source voltage.

DESCRIPTION OF EMBODIMENTS

Embodiments of the disclosure will be described. For convenience in description, components having the same functions as those described previously are denoted by the same signs and will not be elaborated upon.

First Embodiment

Figure 1:
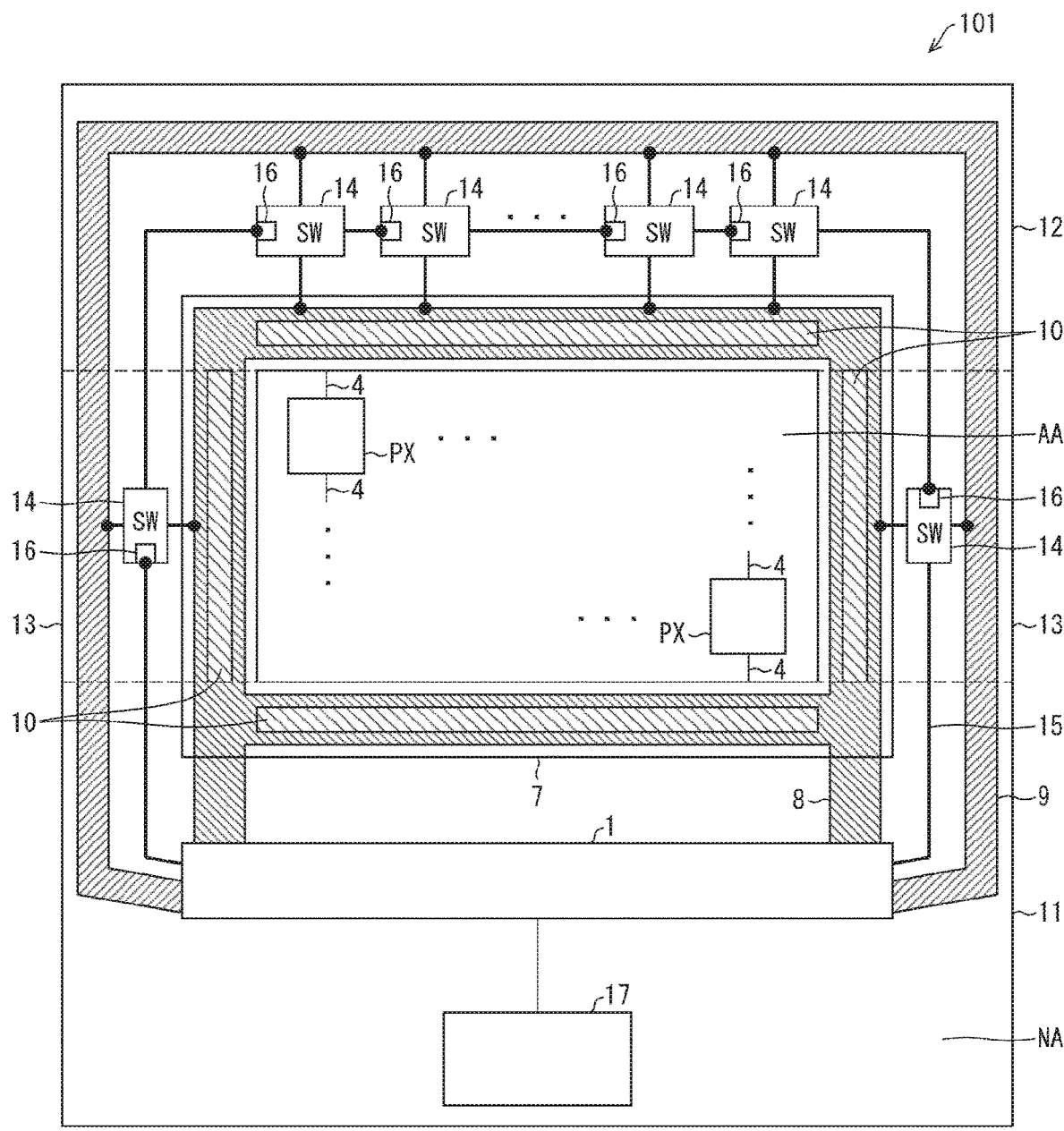
FIG. 1 is a schematic plan view of part of a display device according to a first embodiment of the disclosure.
Figure 2:
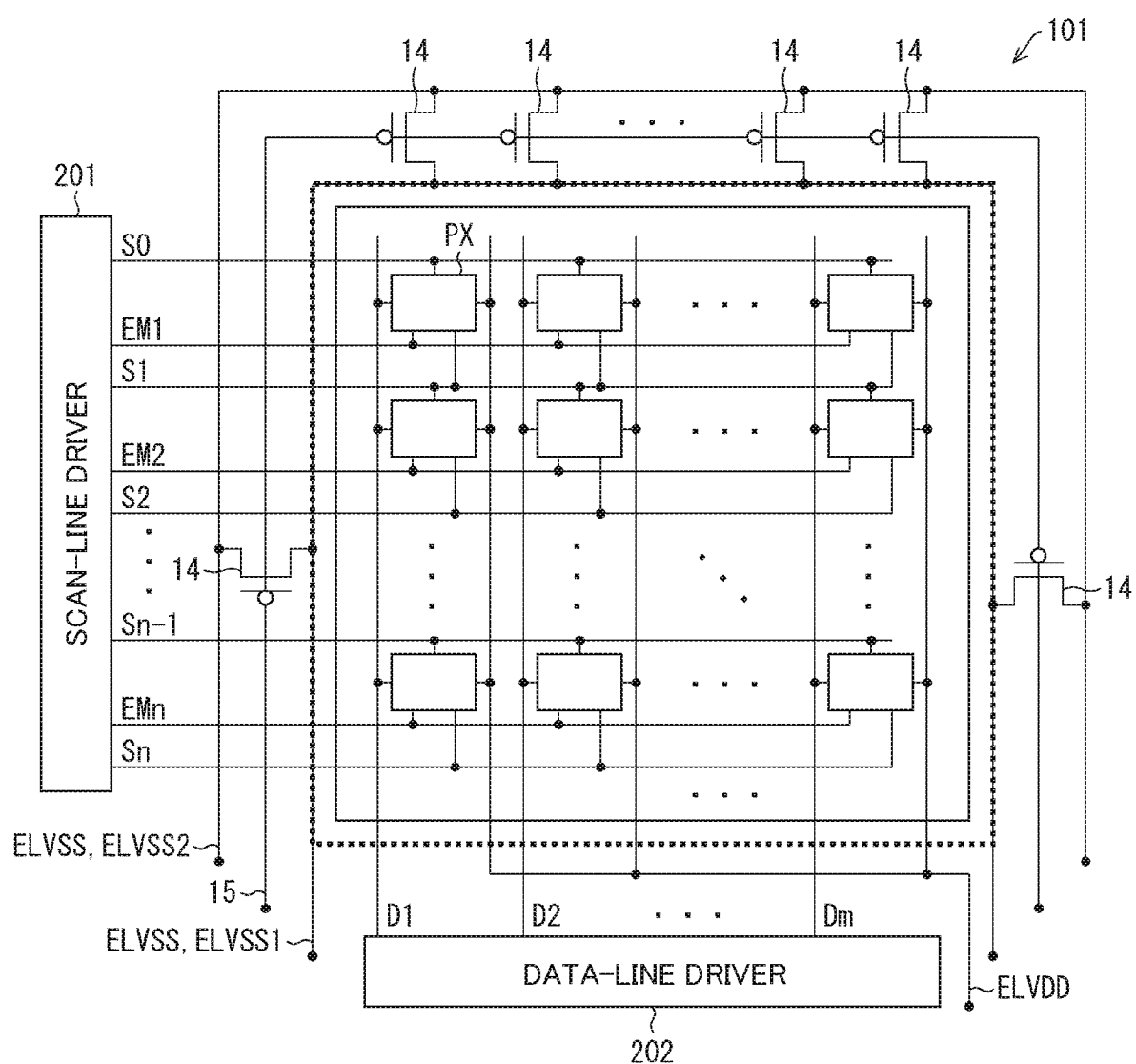
FIG. 2 is a circuit diagram of the display device according to the first embodiment of the disclosure.
Figure 3:
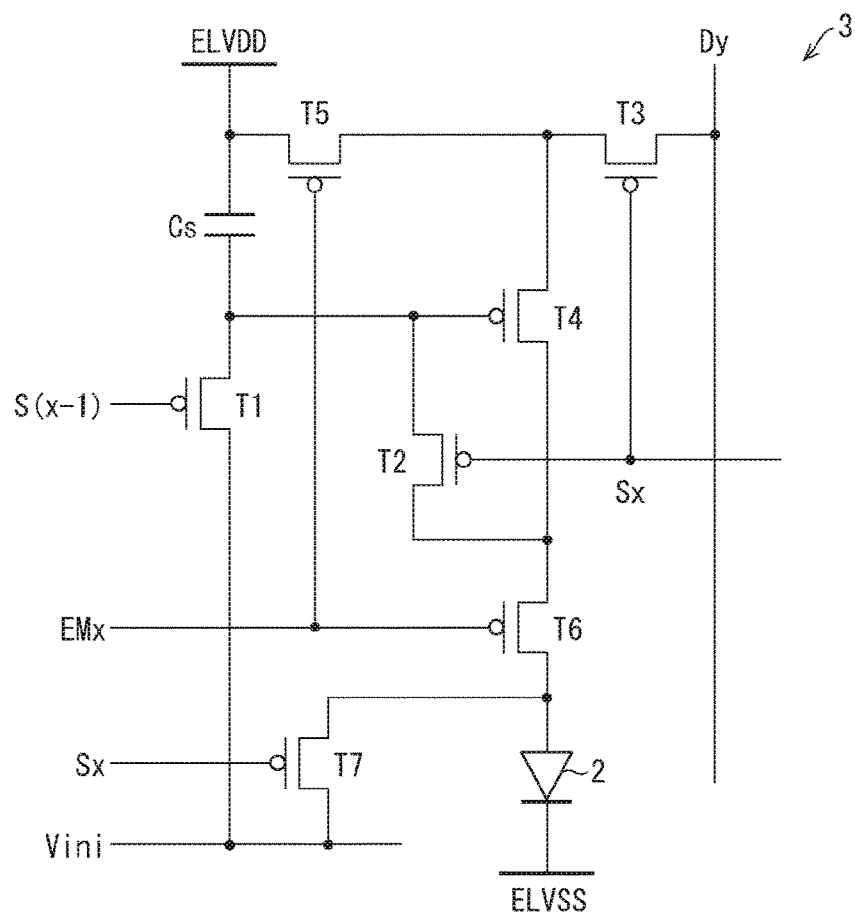
FIG. 3 is a circuit diagram of a pixel of the display device according to the first embodiment of the disclosure.
Figure 4:
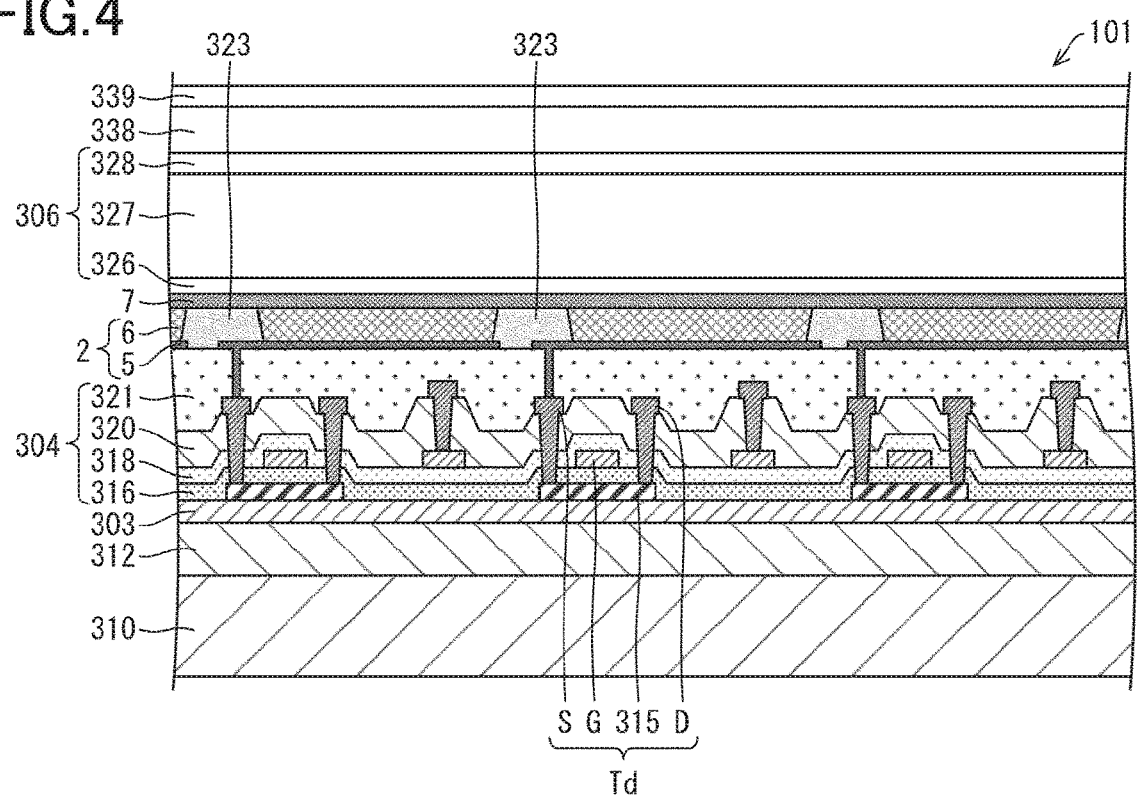
FIG. 4 is a schematic sectional view of part of the display device according to the first embodiment of the disclosure.

FIG. 1 is a schematic plan view of part of a display device 101 according to a first embodiment of the disclosure. FIG. 2 is a circuit diagram of the display device 101. FIG. 3 is a circuit diagram of a pixel PX of the display device 101. FIG. 4 is a schematic sectional view of part of the display device 101.

The display device 101 includes a display region AA and a frame region NA disposed around the display region AA.

The frame region NA partly includes a terminal section 1. To be specific, the terminal section 1 is located on one of the four sides of the frame region NA, which has a rectangular frame shape.

The display region AA includes a plurality of pixels PX. Each pixel PX includes a display element 2 that performs display, and a pixel circuit 3 that drives the display element 2. The display region AA also includes a plurality of power-source voltage lines 4 that apply a power source voltage having a first potential to the plurality of display elements 2 of the pixels PX. That is, the display region AA includes the display elements 2, the pixel circuits 3, and the plurality of power-source voltage lines 4.

Each display element 2 has a first electrode 5 and a function layer 6. The function layer 6 is an OLED light emitter when the display element 2 is an OLED display element. The function layer 6 is a quantum-dot light-emitting diode (QLED) light emitter when the display element 2 is a QLED display element. The first electrode 5 is an anode that is used for the function layer 6 to function.

The display region AA includes a second electrode 7 shared among the function layers 6 of the plurality of display elements 2. The second electrode 7 applies a power source voltage having a second potential, different from the first potential, to the plurality of display elements 2. When as many first electrodes 5 as the display elements 2 are provided as anodes for the respective function layers 6 of the plurality of display elements 2, fewer second electrodes 7 than the anodes are provided as cathodes (for instance, a single cathode) shared among the function layers 6 of the plurality of display elements 2.

The display device 101 includes a main-power-source-voltage stem wire 8 and an auxiliary-power-source-voltage stem wire 9. Each of the main-power-source-voltage stem wire 8 and auxiliary-power-source-voltage stem wire 9 is a single wire or bunch of wires that applies a voltage to the second electrode 7 to apply a power source voltage having the second potential to the display elements 2 of the plurality of pixels PX. The wires 8 and 9 are both electrically connected to the terminal section 1. The main-power-source-voltage stem wire 8 and the auxiliary-power-source-voltage stem wire 9 are both disposed in the frame region NA so as to surround the display region AA, and the auxiliary-power-source-voltage stem wire 9 surrounds the main-power-source-voltage stem wire 8. In other words, the main-power-source-voltage stem wire 8 is disposed around the display region AA, and the auxiliary-power-source-voltage stem wire 9 surrounds the display region AA and main-power-source-voltage stem wire 8. The main-power-source-voltage stem wire 8 is a power source line ELVSS1 having a first low level for instance, which will be described later on, and the auxiliary-power-source-voltage stem wire 9 is a power source line ELVSS2 having a second low level for instance, which will be described later on. The main-power-source-voltage stem wire 8 has a potential different from the potential of the auxiliary-power-source-voltage stem wire 9. When the first electrode 5 is an anode and the second electrode 7 is a cathode, like the display device 101, the potential of the auxiliary-power-source-voltage stem wire 9 is lower than the potential of the main-power-source-voltage stem wire 8.

The frame region NA includes a second-electrode contact 10. A plurality of second-electrode contacts 10 are provided so as to surround the display region AA. The second-electrode contacts 10 are disposed between the second electrode 7 and main-power-source-voltage stem wire 8. The second-electrode contacts 10 are conductors being in contact with the second electrode 7 and main-power-source-voltage stem wire 8. The second electrode 7 and the main-power-source-voltage stem wire 8 are electrically connected together via the second-electrode contacts 10.

FIG. 1 shows the frame region NA divided, along broken lines, into a first frame region 11, a second frame region 12, and a third frame region 13. The first frame region 11 is a region of the frame region NA including the terminal section 1. The second frame region 12 is a region of the frame region NA located opposite the first frame region 11 with reference to the display region AA. The third frame region 13 is a region of the frame region NA interposed between the first frame region 11 and second frame region 12. That is, the frame region NA includes the first frame region 11, which is on a side closer to the terminal section 1 than the display region AA is, the second frame region 12, which is on a side opposite to the first frame region 11, and the third frame region 13, which is located in a direction (the side-to-side direction on the drawing sheet) perpendicular to the direction (the up-and-down direction on the drawing sheet) where the first frame region 11 and second frame region 12 are arranged with reference to the display region AA.

The second frame region 12 includes a plurality of switching transistors 14. The main-power-source-voltage stem wire 8 in the second frame region 12 and the auxiliary-power-source-voltage stem wire 9 in the second frame region 12 are electrically connected together via the plurality of switching transistors 14, which are located in the second frame region 12. The switching transistors 14 electrically connect together the main-power-source-voltage stem wire 8 and auxiliary-power-source-voltage stem wire 9 when they are closed (ON), whereas the switching transistors 14 do not electrically connect together the main-power-source-voltage stem wire 8 and auxiliary-power-source-voltage stem wire 9 when they are open (OFF). Each switching transistor 14 needs to be a component, such as a thin-film transistor (TFT), a micro electro mechanical systems (MEMS), or an integrated circuit (IC) chip, that can switch between opening and closing in response to a signal. The ON resistance of each switching transistor 14 is preferably low as much as possible.

The frame region NA includes a control wire 15 that receives a signal for controlling the opening and closing of the switching transistors 14. The control wire 15 is electrically connected to control electrodes 16 of the switching transistors 14. The control signal accordingly controls the opening and closing of the switching transistors 14. In the display device 101, the control electrodes 16 of the individual switching transistors 14 are electrically connected to one common control wire 15, and the plurality of switching transistors 14 hence basically switch between opening and closing at the same timing.

An IR drop in the power source voltage can conspicuously occur far away from the terminal section 1. The degree of such an IR drop varies depending on an image that is displayed. In the display device 101, the potential of the power source voltage rises at a location where such an IR drop has occurred. The foregoing configuration includes closing the switching transistors 14 in response to a large IR drop, thus enabling the auxiliary-power-source-voltage stem wire 9, having a lower potential than the main-power-source-voltage stem wire 8, to supply power. Consequently, a rise in the potential of the power source voltage can be prevented in the vicinity of the second frame region 12 in the display region AA, which is the farthest location from the terminal section 1. This achieves the display device 101 that prevents such an IR drop.

In some embodiments, the display device 101 may be configured such that the first electrode 5 is a cathode, and such that the second electrode 7 is an anode. In this case, the potential of the auxiliary-power-source-voltage stem wire 9 needs to be higher than the potential of the main-power-source-voltage stem wire 8. That is, the display device 101 in this case has a drop in the potential of its power source voltage occurring at a location where an IR drop has occurred in the power source voltage. The foregoing configuration includes closing the switching transistors 14, thus enabling the auxiliary-power-source-voltage stem wire 9, having a higher potential than the main-power-source-voltage stem wire 8, to supply power. Consequently, a drop in the potential of the power source voltage can be prevented in the vicinity of the second frame region 12 in the display region AA, which is the farthest location from the terminal section 1. This achieves the display device 101 that prevents such an IR drop.

The potential of the auxiliary-power-source-voltage stem wire 9 may be variable. This enables more suitable IR drop prevention in accordance with the degree of an IR drop in the power source voltage.

The display device 101 includes a control circuit 17. The control circuit 17 is electrically connected to the terminal section 1 and supplies, to the control wire 15, a signal for controlling the opening and closing of the switching transistors 14. The control circuit 17 controls the opening and closing of the switching transistors 14 through Method 1 or 2 below for instance. Either one of the methods enables more suitable IR drop prevention based on the susceptibility to and/or degree of an IR drop in the power source voltage. To be specific, the control circuit 17 controls how many of the switching transistors 14 are to be closed and/or which of the switching transistors 14 is to be closed. For instance, the control circuit 17 closes only the switching transistors 14 located on the left side in response to a high-brightness display concentrating on the left side of the display region AA. Although located outside the frame region NA, the control circuit 17 in the display device 101 may be located inside the frame region NA.

Method 1: Control the opening and closing of the switching transistors 14 in accordance with the amount of an IR drop in the power source voltage of the display device 101 calculated based on a display image in the display device 101 (in particular, the grayscale value of image data constituting the display image for instance).

Method 2: Control the opening and closing of the switching transistors 14 in accordance with a potential detected between a node of the main-power-source-voltage stem wire 8 and the terminal section 1. The node of the main-power-source-voltage stem wire 8 herein refers either to a branch point where the main-power-source-voltage stem wire 8 routed from the terminal section 1 branches into at least two directions around the display region AA, or to a location between the branch point and terminal section 1. At this time, a detector (not shown) that detects the potential may be provided in an IC (not shown) of the display device 101.

Like the first frame region 11 and second frame region 12, the third frame region 13 includes the main-power-source-voltage stem wire 8 and the auxiliary-power-source-voltage stem wire 9. The display device 101 further includes other switching transistors 14 between the main-power-source-voltage stem wire 8 and auxiliary-power-source-voltage stem wire 9 in the third frame region 13. This can prevent fluctuations in the potential of the power source voltage near the third frame region 13 in the display region AA on a principle similar to that in the switching transistors 14 disposed in the second frame region 12. In some cases, the third frame region 13 includes no switching transistors 14. This holds true for switching transistors 20 described later on.

The foregoing has described a non-limiting example where multiple switching transistors 14 are provided; a single switching transistor 14 may be provided.

As illustrated in FIG. 2, the display device 101 includes the pixels PX, a scan-line driver 201, and a data-line driver 202. The pixels PX are arranged in matrix at intersections between scan lines S0 to Sn as well as light-emission control lines EM1 to EMn and the data lines D1 to Dm. An external power source not shown applies a high-level voltage to a high-level power source line ELVDD and applies a low-level voltage to a low-level power source line ELVSS. The power source line ELVSS includes the first low-level power source line ELVSS1 and the second low-level power source line ELVSS2. The power source lines ELVSS1 and ELVSS2 are connected together via the switching transistors 14. The switching transistors 14 are controlled by the control wire 15.

The scan-line driver 201 uses a scan-line driving signal, which is input externally, to drive the scan lines S0 to Sn. The scan-line driver 201 also uses a light-emission driving signal to drive the light-emission control lines EM1 to EMn.

The data-line driver 202 generates a data signal on the basis of data externally input and writes the generated data signal to the pixels PX via the data lines D1 to Dm.

As illustrated in FIG. 3, each pixel circuit 3 includes transistors T1 to T7 and a capacitor Cs.

An initialization voltage line Vini is connected to the power source line ELVDD via the transistor T1 and capacitor Cs. The transistor T2 is connected between the transistor T1 and capacitor Cs as well as between the transistors T4 and T6. The yth data line Dy is connected to the power source line ELVDD via the transistors T3 and T5. The transistors T3 and T5 have their individual nodes connected to the power source line ELVSS via the transistor T4, transistor T6 and display element 2. The initialization voltage line Vini is connected between the anode of the display element 2 and the transistor T6 via the transistor T7.

The transistor T1 has a gate connected to the x−1st scan line S(x−1). The transistors T2, T3, and T7 have their individual gates connected to the xth scan line Sx. The transistor T4 has a gate connected between the transistor T1 and capacitor Cs. The transistors T5 and T6 have their individual gates connected to the xth light-emission control line EMx.

Although FIG. 3 illustrates an instance where each pixel circuit 3 includes p-channel transistors, the pixel circuit 3 may include n-channel transistors. The configuration of the display device 101 is effective when a transistor that drives the pixel PX (i.e., corresponding to the transistor T4) is an n-channel type having a low-level power-source potential as a reference potential. The configuration is effective particularly when the gate-source voltage of this drive transistor is equal to the potential difference between the potential of the low-level power source line ELVSS and a storage capacitance (that is, corresponding to the capacitor Cs).

As illustrated in FIG. 4, the display device 101 is a top-emission display device that emits light upward and includes the following sequentially stacked from the bottom: a base material 310, a resin layer 312, a barrier layer 303, a TFT layer 304, the display elements 2, a sealing layer 306, an adhesive layer 338, and a function film 339.

The base material 310 is made of polyethylene terephthalate (PET) for instance. The resin layer 312 is made of, but not limited to, polyimide, epoxy, or polyamide.

The barrier layer 303 prevents moisture and impurities from reaching the TFT layer 304 and display elements 2 when the display device is used. The barrier layer 303 can be composed of, for instance, a silicon oxide film, a silicon nitride film, or a silicon oxide nitride, all of which are formed through CVD, or can be composed of a laminate of these films.

The TFT layer 304 has a stack of, in sequence from the bottom, a semiconductor film 315, an inorganic insulating film 316, a gate electrode G, an inorganic insulating film 318, an inorganic insulating film 320, a source electrode S, a drain electrode D, and a flattening film 321.

The semiconductor film 315, the inorganic insulating film 316 (gate insulating film), and the gate electrode G together constitute a thin-film transistor (light-emission control transistor Td). The source electrode S is connected to the source region of the semiconductor film 315, and the drain electrode D is connected to the drain region of the semiconductor film 315.

The semiconductor film 315 is made of low-temperature polysilicon (LTPS) or oxide semiconductor for instance. It is noted that a TFT having the semiconductor film 315 as its channel may have a top-gate structure or a bottom-gate structure (e.g., a TFT having a channel of oxide semiconductor).

The inorganic insulating films 316, 318, and 320 can be composed of, for instance a silicon oxide (SiOx) film or a silicon nitride (SiNx) film, both of which are formed through CVD, or can be composed of a laminate of these films.

The flattening film (interlayer insulating film) 321 can be made of a photosensitive organic material that can be applied, including polyimide and acrylic.

The gate electrode G, the source electrode S, and the drain electrode D contain, for instance, at least one of aluminum (Al), tungsten (W), molybdenum (Mo), tantalum (Ta), chromium (Cr), titanium (Ti), and copper (Cu). The gate electrode G, the source electrode S, and the drain electrode D are composed of a metal monolayer film or a metal laminated film.

Each display element 2 (e.g., an organic light-emitting diode layer) includes the first electrode 5 disposed on the flattening film 321, a cover film 323 disposed in a higher position than the first electrode 5, and the function layer 6 disposed in a higher position than the cover film 323. Further, the second electrode 7 is disposed in a higher position than the function layer 6. Further, the first electrode 5, the function layer 6, and the second electrode 7 together constitute a light emitter (e.g., an organic light-emitting diode or OLED). The cover film 323 is an organic photosensitive insulating film that can be applied, including polyimide, epoxy, and acrylic, and is patterned so as to cover the edge of the first electrode 5.

The function layer 6 is formed through evaporation or ink jetting so as to overlap the openings of the cover film 323, and the overlapping regions between the openings of the cover film 323 (exposed surface of the first electrode 5) and the function layer 6 constitute light emission regions of sub-pixels. That is, the area of the opening of the cover film 323 exposing the first electrode 5 in a certain sub-pixel constitutes a light emission region in the certain sub-pixel. When the display element 2 is an organic light-emitting diode (OLED) layer, stacked on the exposed surface of the first electrode 5 are, for instance, a hole injection layer, a hole transport layer, the function layer 6, an electron transport layer, and an electron injection layer; the drawing herein shows only the function layer 6.

The first electrode 5 is composed of a stack of, for instance, an indium tin oxide (ITO) and a Ag-containing alloy. The first electrode 5 can reflect light. The second electrode 7 can be composed of a conductor transparent to light, including an MgAg alloy (super-thin film), an indium tin oxide (ITO), and an indium zinc oxide (IZO).

When each display element 2 is an OLED layer, a drive current between the first electrode 5 and second electrode 7 rejoins holes and electrons within the function layer 6, thus generating excitons. These excitons changes to a ground state, thus emitting light. Since the second electrode 7 can transmit light, and the first electrode 5 can reflect light, light from the function layer 6 travels upward and goes out from the top.

Each display element 2 is not limited to an OLED element. Each display element 2 may be an inorganic light-emitting diode or a quantum-dot light-emitting diode.

The sealing layer 306 can transmit light. The sealing layer 306 includes an inorganic sealing film 326 covering the second electrode 7, an organic sealing film 327 disposed in a higher position than the inorganic sealing film 326, and an inorganic sealing film 328 covering the organic sealing film 327. The inorganic sealing films 326 and 328 can be composed of, for instance, a silicon oxide film, a silicon nitride film, or a silicon oxide nitride, all of which are formed through CVD using a mask, or can be composed of a laminate of these films. The organic sealing film 327 is a light-transparency organic film thicker than the inorganic sealing films 326 and 328. The organic sealing film 327 can be made of an organic material that can be applied, such as acrylic. For instance, the organic sealing film 327 is formed by applying an ink containing such an organic material onto the inorganic sealing film 326 through an ink-jet method, followed by curing through UV irradiation. The sealing layer 306 covers the display elements 2 and prevents foreign substances, including moisture and oxygen, from intruding into the display elements 2.

The function film 339 serves as, but not limited to, an optical compensator, a touch sensor or a protector.

Figure 5:
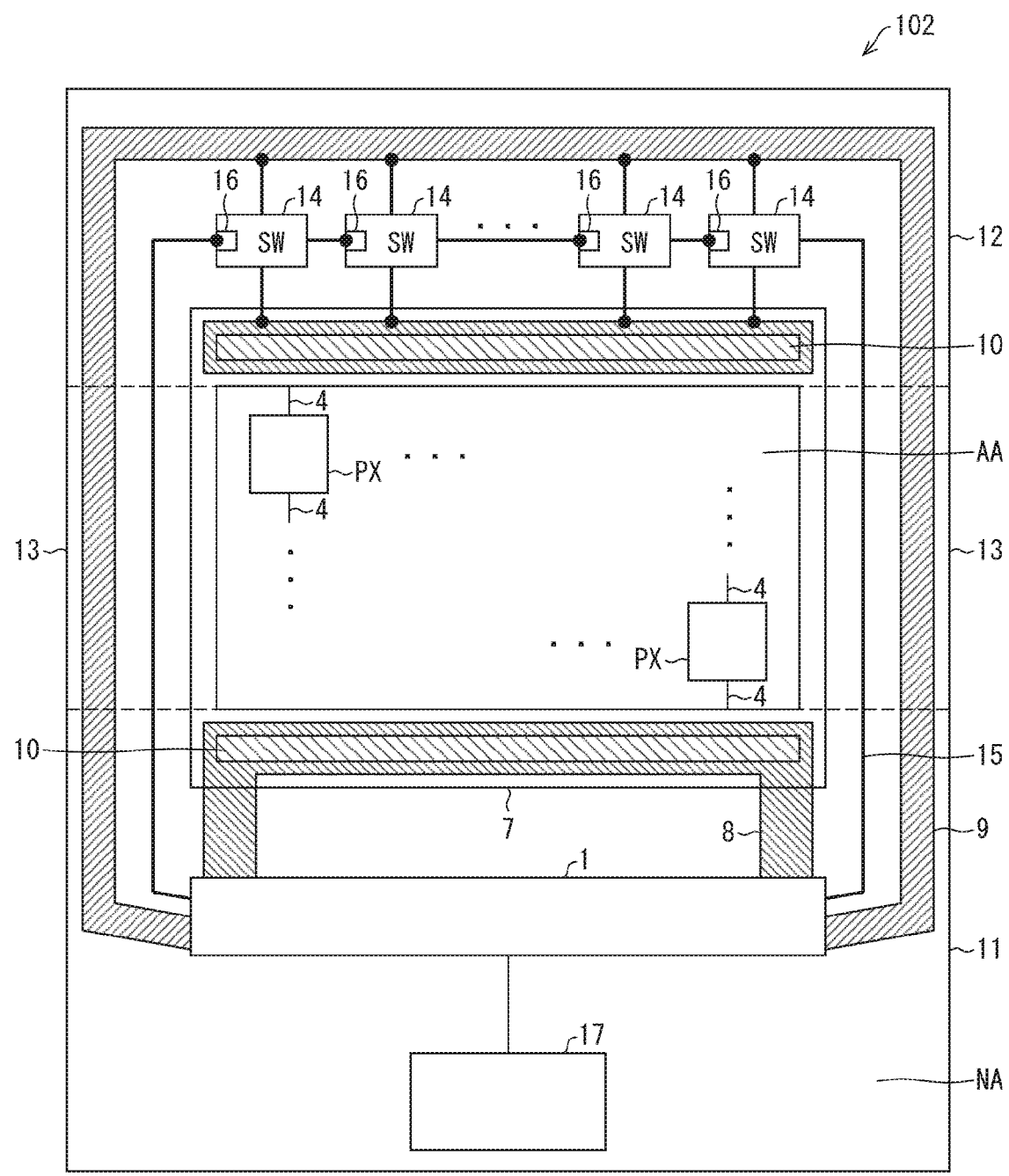
FIG. 5 is a schematic plan view of part of a display device according to a first modification of the first embodiment of the disclosure.

FIG. 5 is a schematic plan view of part of a display device 102 according to a first modification of the first embodiment of the disclosure. The display device 102 is different in configuration from the display device 101 in the following regard.

The display device 102 is configured such that the main-power-source-voltage stem wire 8 and the second-electrode contacts 10 are not disposed in a direction perpendicular to the direction where the first frame region 11 and second frame region 12 are arranged with reference to the display region AA; that is, the main-power-source-voltage stem wire 8 and the second-electrode contacts 10 are not disposed in a region corresponding to the third frame region 13 of the display device 101. That is, the display device 102 includes the main-power-source-voltage stem wire 8 disposed separately in the first frame region 11 and the second frame region 12.

The display device 102, which includes the main-power-source-voltage stem wire 8 smaller in area than that included in the display device 101, is advantageous to reduce its frame.

Figure 6:
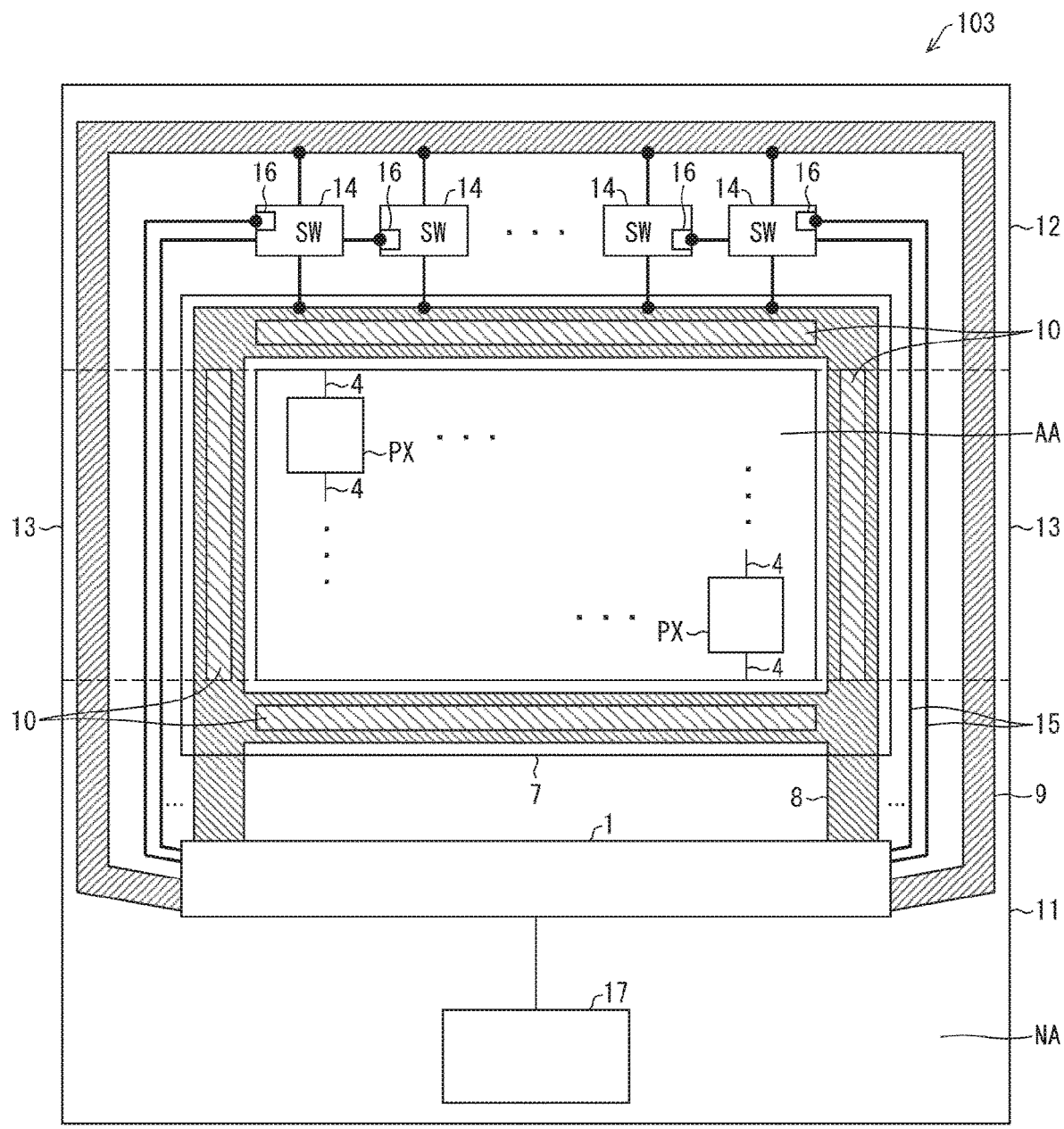
FIG. 6 is a schematic plan view of part of a display device according to a second modification of the first embodiment of the disclosure.

FIG. 6 is a schematic plan view of part of a display device 103 according to a second modification of the first embodiment of the disclosure. The display device 103 is different in configuration from the display device 101 in the following regard.

The display device 103 includes a plurality of control wires 15. Each control wire 15 is electrically connected to the control electrode 16 of a corresponding one of the plurality of switching transistors 14. In other words, different switching transistors 14 are connected to different control wires 15, and their opening and closing is controlled differently. This enables individual control of the opening and closing of the plurality of switching transistors 14.

The display device 103 controls electrical continuity and discontinuity between the main-power-source-voltage stem wire 8 and auxiliary-power-source-voltage stem wire 9 for each switching transistor 14 in accordance with a display image, thereby enabling more suitable prevention of an IR drop in the power source voltage on the basis of the display image. When the display region AA has a high-brightness display concentrating in a particular part for instance, only the switching transistors 14 near the concentrated part are possibly brought into a closed state.

In the display device 103, at least one of the plurality of control wires 15 may be electrically connected to the control electrodes 16 of corresponding two or more of the plurality of switching transistors 14.

Figure 7:
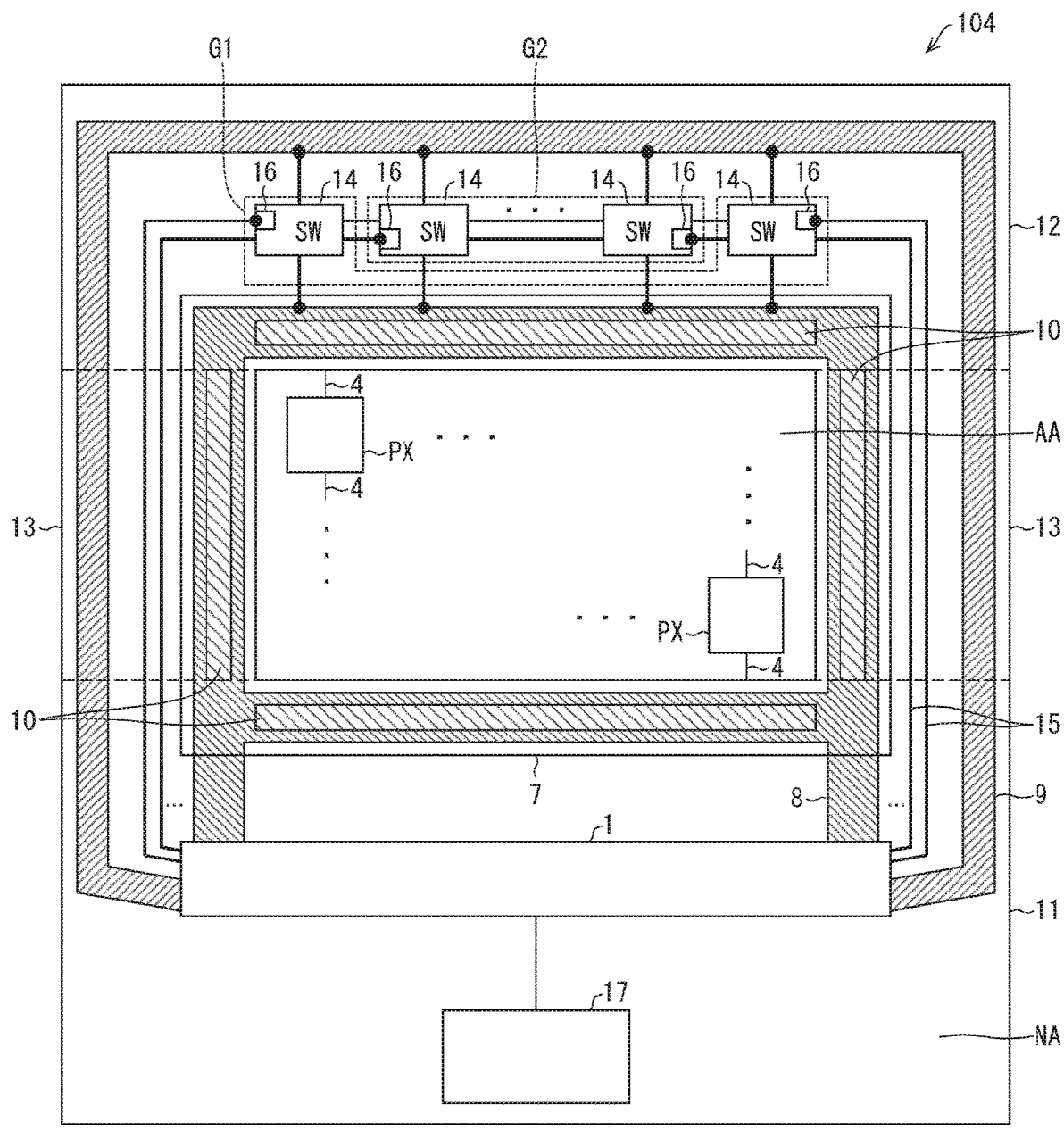
FIG. 7 is a schematic plan view of part of a display device according to a third modification of the first embodiment of the disclosure.

FIG. 7 is a schematic plan view of part of a display device 104 according to a third modification of the first embodiment of the disclosure. The display device 104 is different in configuration from the display device 103 in the following regard.

In the display device 104, each of the plurality of control wires 15 is electrically connected to the control electrodes 16 of corresponding two of the plurality of switching transistors 14. To be specific, the plurality of switching transistors 14 are divided into a plurality of groups: Group G1 and Group G2, in accordance with the distance to and from the terminal section 1 along the corresponding control wire 15. The distance in each switching transistor 14 belonging to Group G2 is longer than the distance in each switching transistor 14 belonging to Group G1. The control electrodes 16 of the plurality of switching transistors 14 belonging to the same group are electrically connected to a common one of the plurality of control wires 15.

The display device 104 enables more suitable IR drop prevention in accordance with the susceptibility to and degree of an IR drop.

In the display device 104, at least one of the plurality of control wires 15 may be electrically connected to the control electrode 16 of a corresponding one of the plurality of switching transistors 14, or to the control electrodes 16 of corresponding three or more of the plurality of switching transistors 14.

Second Embodiment

Figure 8:
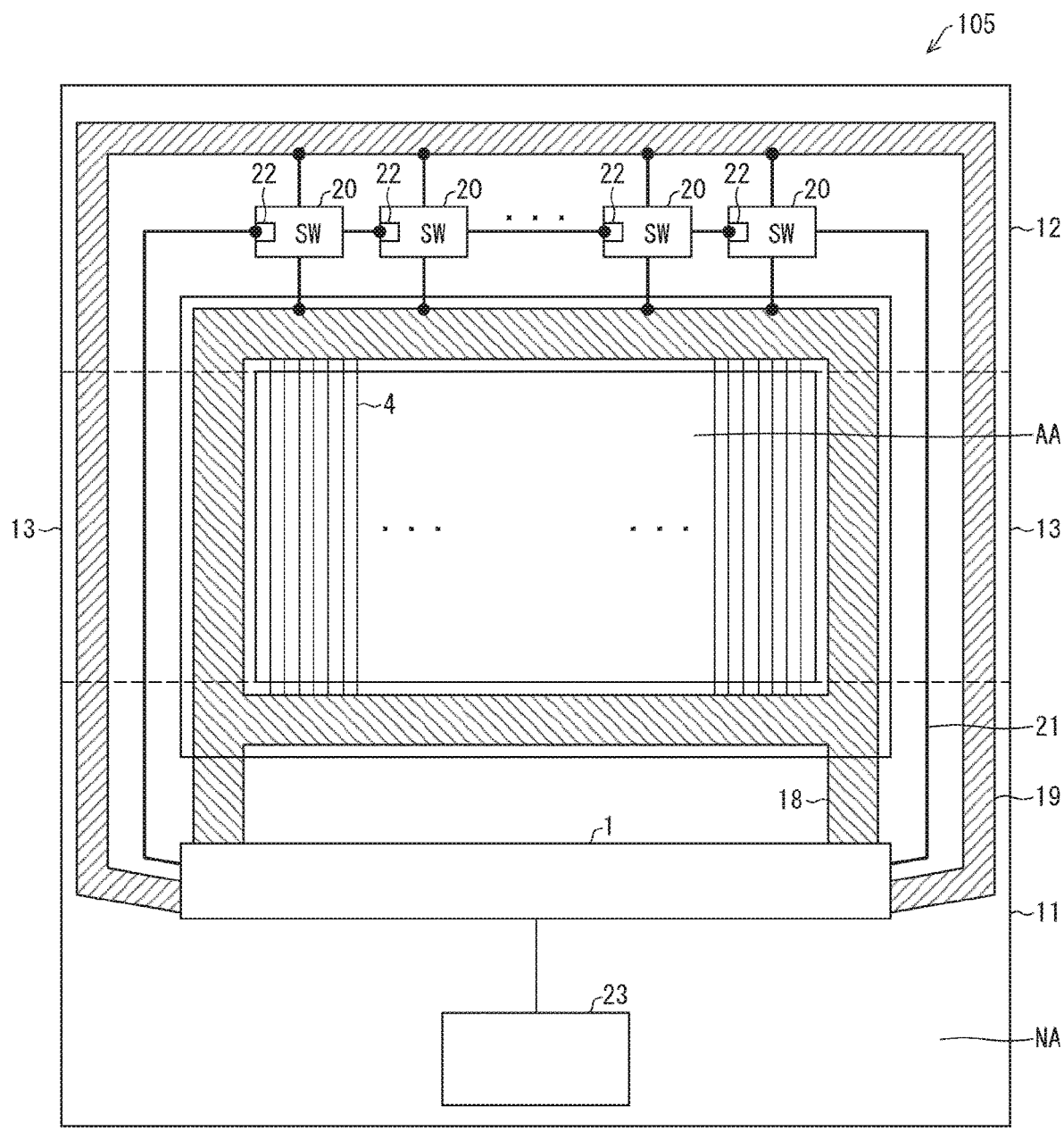
FIG. 8 is a schematic plan view of part of a display device according to a second embodiment of the disclosure.

FIG. 8 is a schematic plan view of part of a display device 105 according to a second embodiment of the disclosure. Like the display device 101, the display device 105 includes the display region AA, the frame region NA, the terminal section 1, the pixels PX (the display elements 2 having their first electrodes 5 and function layers 6, as well as the pixel circuits 3), the plurality of power-source voltage lines 4, the second electrode 7, the main-power-source-voltage stem wire 8, the second-electrode contacts 10, the first frame region 11, the second frame region 12, and the third frame region 13. For easy illustration, the pixels PX, the second electrode 7, the main-power-source-voltage stem wire 8, and the second-electrode contacts 10 are omitted in FIG. 8. In addition, the plurality of power-source voltage lines 4 are illustrated in more detail in FIG. 8 than those in FIG. 1. In the display device 105, the first electrode 5 is an anode, and the second electrode 7 is a cathode.

The display device 105 includes a main-power-source-voltage stem wire 18 and an auxiliary-power-source-voltage stem wire 19. Each of the main-power-source-voltage stem wire 18 and auxiliary-power-source-voltage stem wire 19 is a single wire or bunch of wires that applies a voltage to the plurality of power-source voltage lines 4 to apply a power source voltage having the first potential to the display elements 2 of the plurality of pixels PX. The wires 18 and 19 are both electrically connected to the terminal section 1. The main-power-source-voltage stem wire 18 and the auxiliary-power-source-voltage stem wire 19 are both disposed in the frame region NA so as to surround the display region AA, and the auxiliary-power-source-voltage stem wire 19 surrounds the main-power-source-voltage stem wire 18. The main-power-source-voltage stem wire 18 is, for instance, a power source line ELVDD1 having a first high level, which is a higher potential than the first and second low levels, and the auxiliary-power-source-voltage stem wire 19 is, for instance, a power source line ELVDD2 having a second high level, which is a higher potential than the first and second low levels. The main-power-source-voltage stem wire 18 has a potential different from the potential of the auxiliary-power-source-voltage stem wire 19. When the first electrode 5 is an anode and the second electrode 7 is a cathode, like the display device 105, the potential of the auxiliary-power-source-voltage stem wire 19 is higher than the potential of the main-power-source-voltage stem wire 18. The plurality of power-source voltage lines 4 and the main-power-source-voltage stem wire 18 are electrically connected together.

The second frame region 12 includes a plurality of switching transistors 20. The main-power-source-voltage stem wire 18 and the auxiliary-power-source-voltage stem wire 19 are electrically connected together via the plurality of switching transistors 20, which are located in the second frame region 12. The switching transistors 20 electrically connect together the main-power-source-voltage stem wire 18 and auxiliary-power-source-voltage stem wire 19 when they are closed, whereas the switching transistors 20 do not electrically connect together the main-power-source-voltage stem wire 18 and auxiliary-power-source-voltage stem wire 19 when they are open. Each switching transistor 20 needs to be a component, such as a TFT, an MEMS, or an IC chip, that can switch between opening and closing in response to a signal. The ON resistance of each switching transistor 20 is preferably low as much as possible.

The frame region NA includes a control wire 21 that receives a signal for controlling the opening and closing of the switching transistors 20. The control wire 21 is electrically connected to control electrodes 22 of the switching transistors 20. The control signal accordingly controls the opening and closing of the switching transistors 20. In the display device 105, the control electrodes 22 of the individual switching transistors 20 are electrically connected to one common control wire 21, and the plurality of switching transistors 20 hence basically switch between opening and closing at the same timing.

An IR drop in the power source voltage can conspicuously occur far away from the terminal section 1. The display device 105 has a drop in the potential of its power source voltage occurring at a location where such an IR drop has occurred. The foregoing configuration includes closing the switching transistors 20, thus enabling the auxiliary-power-source-voltage stem wire 19, having a higher potential than the main-power-source-voltage stem wire 18, to supply power. Consequently, a drop in the potential of the power source voltage can be prevented in the vicinity of the second frame region 12 in the display region AA, which is the farthest location from the terminal section 1. This achieves the display device 105 that prevents such an IR drop.

In some embodiments, the display device 105 may be configured such that the first electrode 5 is a cathode, and such that the second electrode 7 is an anode. In this case, the potential of the auxiliary-power-source-voltage stem wire 19 needs to be lower than the potential of the main-power-source-voltage stem wire 18. That is, the display device 105 in this case has a rise in the potential of its power source voltage occurring at a location where an IR drop has occurred in the power source voltage. The foregoing configuration includes closing the switching transistors 20, thus enabling the auxiliary-power-source-voltage stem wire 19, having a lower potential than the main-power-source-voltage stem wire 18, to supply power. Consequently, a rise in the potential of the power source voltage can be prevented in the vicinity of the second frame region 12 in the display region AA, which is the farthest location from the terminal section 1. This achieves the display device 105 that prevents such an IR drop.

The potential of the auxiliary-power-source-voltage stem wire 19 may be variable. This enables more suitable IR drop prevention in accordance with the degree of an IR drop in the power source voltage.

The display device 105 includes a control circuit 23. The control circuit 23 is electrically connected to the terminal section 1 and supplies, to the control wire 21, a signal for controlling the opening and closing of the switching transistors 20. The control circuit 23 controls the opening and closing of the switching transistors 20 through Method 3 or 4 below for instance. Either one of the methods enables more suitable IR drop prevention based on the susceptibility to and/or degree of an IR drop in the power source voltage. To be specific, the control circuit 23 controls how many of the switching transistors 20 are to be closed and/or which of the switching transistors 20 is to be closed. For instance, the control circuit 23 closes only the switching transistors 20 located on the left side in response to a high-brightness display concentrating on the left side of the display region AA. Although located outside the frame region NA, the control circuit 23 in the display device 105 may be located inside the frame region NA.

Method 3: Control the opening and closing of the switching transistors 20 in accordance with the amount of an IR drop in the power source voltage of the display device 105 calculated based on a display image in the display device 105 (in particular, the grayscale value of image data constituting the display image for instance).

Method 4: Control the opening and closing of the switching transistors 20 in accordance with a potential detected between a node of the main-power-source-voltage stem wire 18 and the terminal section 1. The node of the main-power-source-voltage stem wire 18 herein refers either to a branch point where the main-power-source-voltage stem wire 18 routed from the terminal section 1 branches into at least two directions around the display region AA, or to a location between the branch point and terminal section 1. At this time, a detector (not shown) that detects the potential may be provided in an IC (not shown) of the display device 105.

Like the first frame region 11 and second frame region 12, the third frame region 13 includes the main-power-source-voltage stem wire 18 and the auxiliary-power-source-voltage stem wire 19. The display device 105 may further include other switching transistors 20 between the main-power-source-voltage stem wire 18 and auxiliary-power-source-voltage stem wire 19 in the third frame region 13. This can prevent fluctuations in the potential of the power source voltage near the third frame region 13 in the display region AA on a principle similar to that in the switching transistors 20 disposed in the second frame region 12.

The foregoing has described a non-limiting example where multiple switching transistors 20 are provided; a single switching transistor 20 may be provided.

The configuration of the display device 105 is effective when a transistor that drives the pixel PX is a p-channel type having a high-level power-source potential as a reference potential. The configuration is effective particularly when the gate-source voltage of this drive transistor is equal to the potential difference between the potential of the high-level power source line ELVDD and a storage capacitance.

The display device 105 can be combined with the foregoing configurations of the respective modifications of the first embodiment. That is, based on the display device 102, the display device 105 may be configured such that a region corresponding to the third frame region 13 of the display device 105 includes no main-power-source-voltage stem wire 18. Further, based on the display device 103, the display device 105 may include a plurality of control wires 21, each of which may be electrically connected to the control electrode 22 of a corresponding one of the plurality of switching transistors 20. Still further, based on the display device 104, the display device 105 may be configured such that the plurality of switching transistors 20 are divided into a plurality of groups in accordance with the distance to and from the terminal section 1, and such that the control electrodes 22 of the plurality of switching transistors 20 belonging to the same group are electrically connected to a common one of the plurality of control wires 21.

Third Embodiment

One display device may have the characteristic configurations of the display devices 101 to 104 (see FIGS. 1 to 7) as well as the characteristic configuration of the display device 105 (see FIG. 8). It can be interpreted in this case that the display device includes the following four components.

The main-power-source-voltage stem wire (first main-power-source-voltage stem wire) 18 electrically connected to the plurality of power-source voltage lines 4

The auxiliary-power-source-voltage stem wire (first auxiliary-power-source-voltage stem wire) 19 electrically connected to the main-power-source-voltage stem wire 18 via the switching transistors (first switching transistors) 20

The main-power-source-voltage stem wire (second main-power-source-voltage stem wire) 8 electrically connected to the second electrode 7

The auxiliary-power-source-voltage stem wire (second auxiliary-power-source-voltage stem wire) 9 electrically connected to the main-power-source-voltage stem wire 8 via the switching transistors (second switching transistors) 14

In such a display device that includes the first electrode 5 serving as an anode and the second electrode 7 serving as a cathode, the auxiliary-power-source-voltage stem wire 19 has a potential higher than the potential of the main-power-source-voltage stem wire 18, and the auxiliary-power-source-voltage stem wire 9 has a potential lower than the potential of the main-power-source-voltage stem wire 8.

In such a display device that includes the first electrode 5 serving as a cathode and the second electrode 7 serving as an anode, the auxiliary-power-source-voltage stem wire 19 has a potential lower than the potential of the main-power-source-voltage stem wire 18, and the auxiliary-powersource-voltage stem wire 9 has a potential higher than the potential of the main-power-source-voltage stem wire 8.

Fourth Embodiment

Figure 9:
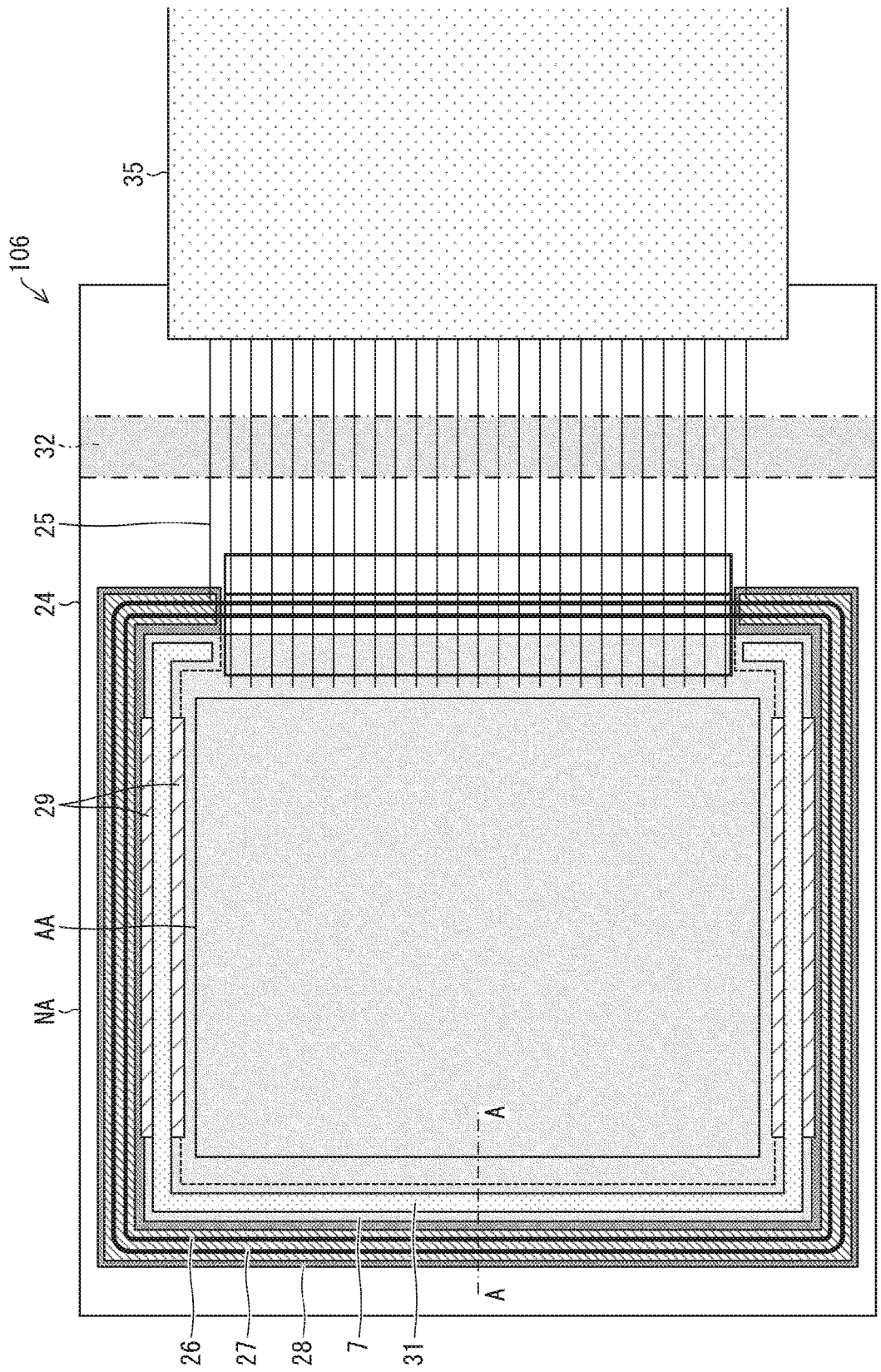
FIG. 9 is a schematic plan view of part of a display device according to a fourth embodiment of the disclosure.
Figure 10:
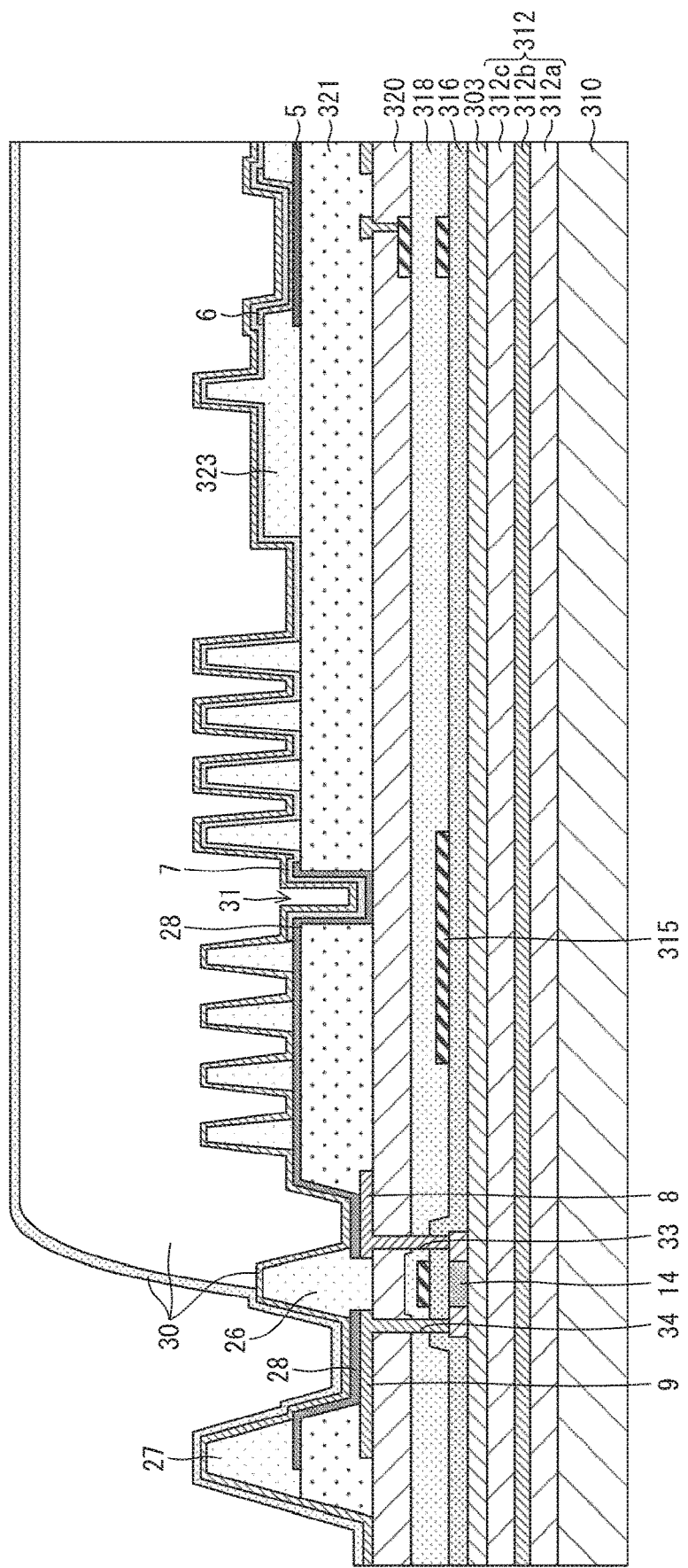
FIG. 10 is a sectional view taken along line A-A in FIG. 9.

FIG. 9 is a schematic plan view of part of a display device 106 according to a fourth embodiment of the disclosure. FIG. 10 is a sectional view taken along line A-A in FIG. 9. The display device 106 is a specific structural example of the display device 101.

In FIG. 10, the same components as those illustrated in FIG. 3 or 4 are denoted by the same signs as those denoted in FIG. 3 or 4, and their description is omitted. In FIG. 10, the resin layer 312 is a three-ply layer consisting of a polyimide film 312*a*, an inorganic insulating film 312*b* and a polyimide film 312*c*.

The display device 106 includes a substrate 24, a routed wire 25, a first back 26, a second bank 27, a conductive film 28, a GDM 29, and a sealing film 30. The display device 106 also includes a trench 31 as well as contact holes 33 and 34. Here, FIG. 9 shows a component 35, which is a flexible substrate. The first bank 26, the second bank 27, and the trench 31 are disposed in the frame region NA, and the sealing film 30 extends from the display region AA to the frame region NA. As illustrated in FIG. 9, the substrate 24 may have a bending section 32 along which the substrate 24 is bendable. The GDM 29 is a TFT disposed on both sides of the trench 31.

The trench 31 surrounds the display region AA. The first bank 26 surrounds the trench 31. The second bank 27 surrounds the first bank 26.

The conductive film 28 is disposed in the same layer and made of the same material as the first electrode 5 (see FIG. 1). The main-power-source-voltage stem wire 8 and the second electrode 7 are electrically connected together via the conductive film 28. Further, the second electrode 7 and the conductive film 28 are in contact with each other in the trench 31.

The main-power-source-voltage stem wire 8 is disposed between the first bank 26 and display region AA, and the auxiliary-power-source-voltage stem wire 9 is disposed between the second bank 27 and first bank 26.

As illustrated in FIGS. 9 and 10, the display device 106 is configured in the following manner. In the frame region NA, the main-power-source-voltage stem wire 8 and the second electrode 7 are electrically connected together. In addition, the auxiliary-power-source-voltage stem wire 9 is disposed outside the main-power-source-voltage stem wire 8. In addition, the main-power-source-voltage stem wire 8 is connected to the switching transistors 14 via the contact hole 33, and the auxiliary-power-source-voltage stem wire 9 is connected to the switching transistors 14 via the contact hole 34.

Figure 11:
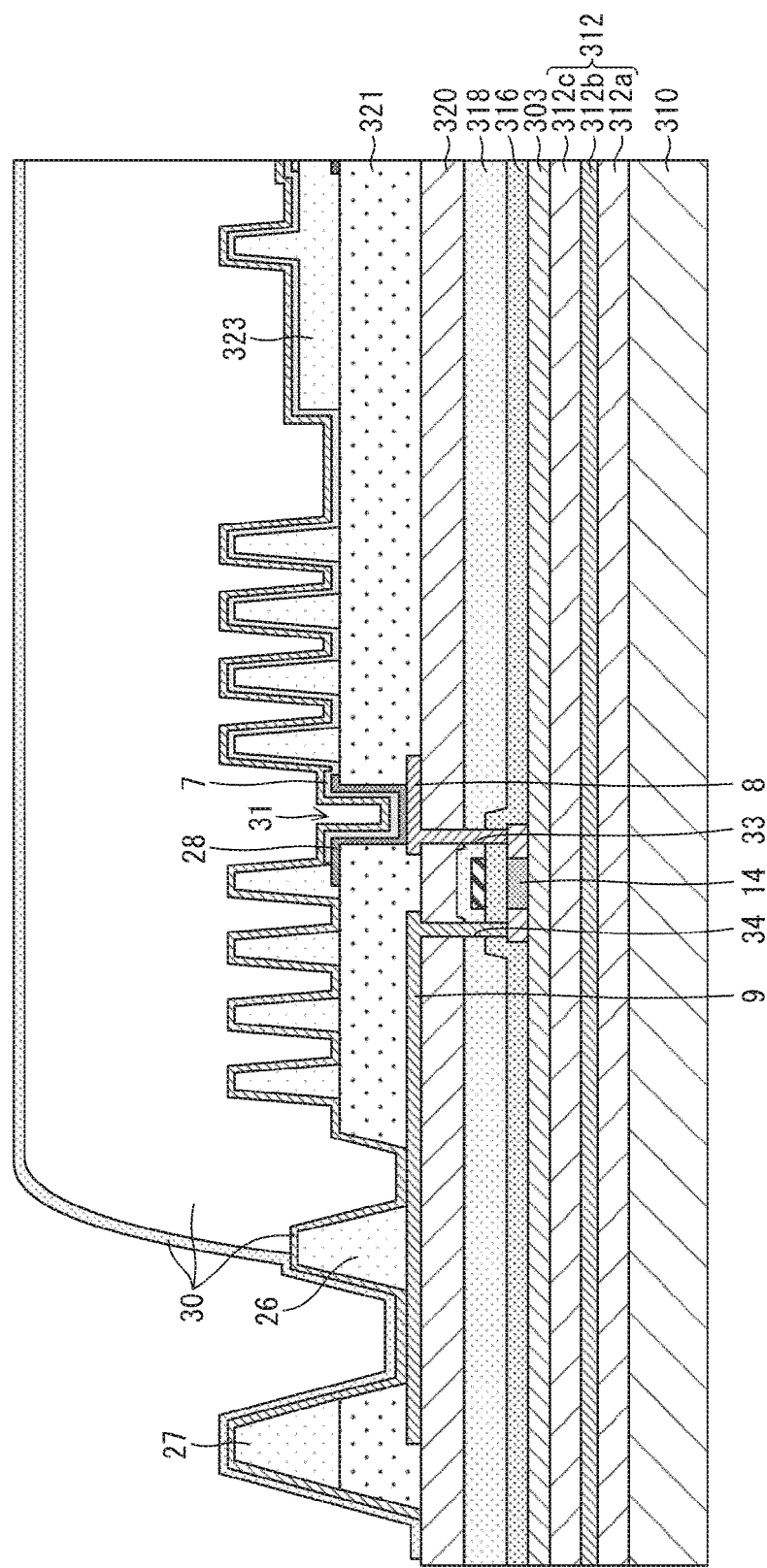
FIG. 11 is a sectional view of a modification illustrated in FIG. 10.

FIG. 11 is a sectional view of a modification illustrated in FIG. 10. As illustrated in FIG. 11, the main-power-source-voltage stem wire 8 may be in contact with the conductive film 28 in the trench 31, and the auxiliary-power-source-voltage stem wire 9 may be disposed between the second bank 27 and trench 31.

Not only the display device 101, but also the display device according to the third embodiment of the disclosure, which includes the main-power-source-voltage stem wire 8 and the auxiliary-power-source-voltage stem wire 9, can use the structure described with reference to the display device 106.

The electro-optical elements (electro-optical elements having brightness and transmittancy that are regulated by current) included in the display device according to each embodiment described above are not restrictive. The display device according to each embodiment may include OLEDs for instance as electro-optical elements. The display device according to each embodiment may be thus an organic electro-luminescence (EL) display that includes OLEDs for instance. Alternatively, the display device according to each embodiment may be an inorganic EL display that includes inorganic light-emitting diodes as electro-optical elements. Alternatively, the display device according to each embodiment may be a QLED display that includes QLEDs as electro-optical elements.

Summary

A display device according to a first aspect of the disclosure includes a display region and a frame region disposed around the display region. The frame region partly includes a terminal section. The display region includes the following: display elements that perform display; pixel circuits that drive the display elements; and a plurality of power-source voltage lines that apply a power source voltage having a first potential to the display elements. Each display element includes a first electrode and a function layer. The display region is shared among the function layers. The display device also includes a second electrode that applies, to the display elements, a power source voltage having a second potential different from the first potential. The frame region includes a main-power-source-voltage stem wire and an auxiliary-power-source-voltage stem wire both provided for applying, to the display elements, the power source voltage having the first potential or the power source voltage having the second potential. The frame region includes a first frame region having the terminal section, and a second frame region located opposite the first frame region with reference to the display region. The main-power-source-voltage stem wire has a potential different from the potential of the auxiliary-power-source-voltage stem wire. The main-power-source-voltage stem wire disposed in the second frame region of the frame region and the auxiliary-power-source-voltage stem wire disposed in the second frame region of the frame region are electrically connected together via a switching transistor disposed in the second frame region.

An IR drop in the power source voltage can conspicuously occur far away from the terminal section. The degree of such an IR drop varies depending on an image that is displayed. The foregoing configuration includes closing the switching transistor in response to a large IR drop, thus enabling the auxiliary-power-source-voltage stem wire, having a potential different from that of the main-power-source-voltage stem wire, to supply power. Consequently, fluctuations in the potential of the power source voltage can be prevented in the vicinity of the second frame region in the display region, which is the farthest location from the terminal section. This achieves a display device that prevents such an IR drop.

The display device according to a second aspect of the disclosure is configured, in the first aspect, such that the main-power-source-voltage stem wire is electrically connected to the second electrode.

The display device according to a third aspect of the disclosure is configured, in the second aspect, such that the first electrode is an anode, and such that the second electrode is a cathode. The display device is also configured such that the potential of the auxiliary-power-source-voltage stem wire is lower than the potential of the main-power-source-voltage stem wire.

The display device according to a fourth aspect of the disclosure is configured, in the second aspect, such that the first electrode is a cathode, and such that the second electrode is an anode. The display device is also configured such that the potential of the auxiliary-power-source-voltage stem wire is higher than the potential of the main-power-source-voltage stem wire.

The display device according to a fifth aspect of the disclosure is configured, in the first aspect, such that the main-power-source-voltage stem wire is electrically connected to the plurality of power-source voltage lines.

The display device according to a sixth aspect of the disclosure is configured, in the fifth aspect, such that the first electrode is an anode, and such that the second electrode is a cathode. The display device is also configured such that the potential of the auxiliary-power-source-voltage stem wire is higher than the potential of the main-power-source-voltage stem wire.

The display device according to a seventh aspect of the disclosure is configured, in the fifth aspect, such that the first electrode is a cathode, and such that the second electrode is an anode. The display device is also configured such that the potential of the auxiliary-power-source-voltage stem wire is lower than the potential of the main-power-source-voltage stem wire.

In the first aspect, the display device according to an eighth aspect of the disclosure includes the following: a first main-power-source-voltage stem wire electrically connected to the plurality of power-source voltage lines; a first auxiliary-power-source-voltage stem wire electrically connected to the first main-power-source-voltage stem wire via a first switching transistor; a second main-power-source-voltage stem wire electrically connected to the second electrode; and a second auxiliary-power-source-voltage stem wire electrically connected to the second main-power-source-voltage stem wire via a second switching transistor.

The display device according to a ninth aspect of the disclosure is configured, in the eighth aspect, such that the first electrode is an anode, and such that the second electrode is a cathode. The display device is also configured such that the first auxiliary-power-source-voltage stem wire has a potential higher than the potential of the first main-power-source-voltage stem wire, and such that the second auxiliary-power-source-voltage stem wire has a potential lower than the potential of the second main-power-source-voltage stem wire.

The display device according to a tenth aspect of the disclosure is configured, in the eighth aspect, such that the first electrode is a cathode, and such that the second electrode is an anode. The display device is also configured such that the first auxiliary-power-source-voltage stem wire has a potential lower than the potential of the first main-power-source-voltage stem wire, and such that the second auxiliary-power-source-voltage stem wire has a potential higher than the potential of the second main-power-source-voltage stem wire.

The display device according to an eleventh aspect of the disclosure is configured, in any of the second to fourth aspects and of the eighth to tenth aspects, such that the frame region includes the following: a trench surrounding the display region; a first bank surrounding the trench; a second bank surrounding the first bank; and a sealing film. The main-power-source-voltage stem wire and the second electrode are electrically connected together via a conductive film disposed in the same layer and made of the same material as the first electrode. The second electrode and the conductive film are in contact with each other in the trench.

The display device according to a twelfth aspect of the disclosure is configured, in the eleventh aspect, such that the main-power-source-voltage stem wire is in contact with the conductive film in the trench, and such that the auxiliary-power-source-voltage stem wire is disposed between the second bank and the trench.

The display device according to a thirteenth aspect of the disclosure is configured, in the eleventh aspect, such that the main-power-source-voltage stem wire is disposed between the first bank and the display region, and such that the auxiliary-power-source-voltage stem wire is disposed between the second bank and the first bank.

The display device according to a fourteenth aspect of the disclosure is configured, in any of the first to thirteenth aspects, such that the potential of the auxiliary-power-source-voltage stem wire is variable.

The foregoing configuration enables more suitable IR drop prevention in accordance with the degree of an IR drop in the power source voltage.

The display device according to a fifteenth aspect of the disclosure is configured, in any of the first to fourteenth aspects, such that the second frame region includes a plurality of the switching transistors.

The display device according to a sixteenth aspect of the disclosure is configured, in the fifteenth aspect, such that the plurality of switching transistors have individual control electrodes electrically connected to a common control wire.

In the fifteenth aspect, the display device according to a seventeenth aspect of the disclosure further includes a plurality of control wires. Each of the plurality of control wires is electrically connected to a control electrode of at least one corresponding switching transistor included in the plurality of switching transistors.

The display device according to an eighteenth aspect of the disclosure is configured, in the seventeenth aspect, such that the plurality of switching transistors are divided into a plurality of groups in accordance with a distance to and from the terminal section along a corresponding one of the plurality of control wires, and such that the plurality of switching transistors belonging to the same group have individual control electrodes electrically connected to a common one of the plurality of control wires.

The foregoing configuration enables more suitable IR drop prevention in accordance with the susceptibility to and degree of an IR drop.

In any of the first to eighteenth aspects, the display device according to a nineteenth aspect of the disclosure includes a third frame region interposed between the first and second frame regions. The third frame region includes the main-power-source-voltage stem wire and the auxiliary-power-source-voltage stem wire. The third frame region further includes the switching transistor between the main-power-source-voltage stem wire and the auxiliary-power-source-voltage stem wire.

The foregoing configuration can prevent fluctuations in the potential of the power-source voltage near the third frame region in the display region on a principle similar to that in the switching transistors disposed in the second frame region.

In any of the first to nineteenth aspects, the display device according to a twentieth aspect of the disclosure includes a control circuit that controls the opening and closing of the switching transistor in accordance with the amount of an IR drop in the power source voltage of the display device calculated based on a display image in the display device.

The foregoing configuration enables more suitable IR drop prevention in accordance with the susceptibility to and/or degree of an IR drop in the power source voltage.

In any of the first to nineteenth aspects, the display device according to a twenty-first aspect of the disclosure includes a control circuit that controls the opening and closing of the switching transistor in accordance with a potential detected between a node of the main-power-source-voltage stem wire and the terminal section.

The foregoing configuration enables more suitable IR drop prevention in accordance with the susceptibility to and/or degree of an IR drop in the power source voltage.

The display device according to a twenty-second aspect of the disclosure is configured, in any of the first to twenty-first aspects, such that the main-power-source-voltage stem wire is disposed around the display region, and such that the auxiliary-power-source-voltage stem wire surrounds the display region and the main-power-source-voltage stem wire.

The disclosure is not limited to the foregoing embodiments, and various modifications can be thus devised within the scope of the claims. The technical scope of the present invention includes an embodiment as well that is obtained in combination, as necessary, with the technical means disclosed in the respective embodiments. Furthermore, combining the technical means disclosed in the respective embodiments can form a new technical feature.

The invention claimed is:

1. A display device comprising:
a display region; and
a frame region disposed around the display region,
the frame region partly including a terminal section,
the display region including
    display elements configured to perform display,
    pixel circuits configured to drive the display elements, and
    a plurality of power-source voltage lines configured to apply a power source voltage having a first potential to the display elements,
each of the display elements including
    a first electrode, and
    a function layer,
the display region being shared among the function layers,
the display device comprising
a second electrode configured to apply, to the display elements, a power source voltage having a second potential different from the first potential,
wherein the frame region includes
    a main-power-source-voltage stem wire and an auxiliary-power-source-voltage stem wire both provided for applying, to the display elements, the power source voltage having the first potential or the power source voltage having the second potential,
the frame region includes
    a first frame region having the terminal section, and
    a second frame region located opposite the first frame region with reference to the display region,
the main-power-source-voltage stem wire has a potential different from a potential of the auxiliary-power-source-voltage stem wire, and
the main-power-source-voltage stem wire disposed in the second frame region of the frame region and the auxiliary-power-source-voltage stem wire disposed in the second frame region of the frame region are electrically connected together via a switching transistor disposed in the second frame region.

2. The display device according to claim 1, wherein the main-power-source-voltage stem wire is electrically connected to the second electrode.

3. The display device according to claim 2, wherein
the first electrode is an anode,
the second electrode is a cathode, and
the potential of the auxiliary-power-source-voltage stem wire is lower than the potential of the main-power-source-voltage stem wire.

4. The display device according to claim 2, wherein
the first electrode is a cathode,
the second electrode is an anode, and
the potential of the auxiliary-power-source-voltage stem wire is higher than the potential of the main-power-source-voltage stem wire.

5. The display device according to claim 1, wherein the main-power-source-voltage stem wire is electrically connected to the plurality of power-source voltage lines.

6. The display device according to claim 5, wherein
the first electrode is an anode,
the second electrode is a cathode, and
the potential of the auxiliary-power-source-voltage stem wire is higher than the potential of the main-power-source-voltage stem wire.

7. The display device according to claim 5, wherein
the first electrode is a cathode,
the second electrode is an anode, and
the potential of the auxiliary-power-source-voltage stem wire is lower than the potential of the main-power-source-voltage stem wire.

8. The display device according to claim 1, comprising:
a first main-power-source-voltage stem wire electrically connected to the plurality of power-source voltage lines;
a first auxiliary-power-source-voltage stem wire electrically connected to the first main-power-source-voltage stem wire via a first switching transistor;
a second main-power-source-voltage stem wire electrically connected to the second electrode; and
a second auxiliary-power-source-voltage stem wire electrically connected to the second main-power-source-voltage stem wire via a second switching transistor.

9. The display device according to claim 8, wherein
the first electrode is an anode,
the second electrode is a cathode,
the first auxiliary-power-source-voltage stem wire has a potential higher than a potential of the first main-power-source-voltage stem wire, and
the second auxiliary-power-source-voltage stem wire has a potential lower than a potential of the second main-power-source-voltage stem wire.

10. The display device according to claim 8, wherein
the first electrode is a cathode,
the second electrode is an anode,
the first auxiliary-power-source-voltage stem wire has a potential lower than a potential of the first main-power-source-voltage stem wire, and
the second auxiliary-power-source-voltage stem wire has a potential higher than a potential of the second main-power-source-voltage stem wire.

11. The display device according to claim 2, wherein
the frame region includes
    a trench surrounding the display region,
    a first bank surrounding the trench,
    a second bank surrounding the first bank, and
    a sealing film,
wherein the main-power-source-voltage stem wire and the second electrode are electrically connected together via a conductive film disposed in the same layer and made of the same material as the first electrode, and the second electrode and the conductive film are in contact with each other in the trench.

12. The display device according to claim 11, wherein the main-power-source-voltage stem wire is in contact with the conductive film in the trench, and the auxiliary-power-source-voltage stem wire is disposed between the second bank and the trench.

13. The display device according to claim 11, wherein the main-power-source-voltage stem wire is disposed between the first bank and the display region, and the auxiliary-power-source-voltage stem wire is disposed between the second bank and the first bank.

14. The display device according to claim 1, wherein the potential of the auxiliary-power-source-voltage stem wire is variable.

15. The display device according claim 1, wherein the second frame region includes a plurality of the switching transistors.

16. The display device according to claim 15, wherein the plurality of switching transistors have individual control electrodes electrically connected to a common control wire.

17. The display device according to claim 15, further comprising a plurality of control wires, wherein each of the plurality of control wires is electrically connected to a control electrode of at least one corresponding switching transistor included in the plurality of switching transistors.

18. The display device according to claim 1, comprising a third frame region interposed between the first and second frame regions, wherein the third frame region includes the main-power-source-voltage stem wire and the auxiliary-power-source-voltage stem wire, and the third frame region further includes the switching transistor between the main-power-source-voltage stem wire and the auxiliary-power-source-voltage stem wire.

19. The display device according to claim 1, comprising a control circuit configured to control opening and closing of the switching transistor in accordance with an amount of an IR drop in the power source voltage of the display device calculated based on a display image in the display device.

20. The display device according to claim 1, comprising a control circuit configured to control opening and closing of the switching transistor in accordance with a potential detected between a node of the main-power-source-voltage stem wire and the terminal section.

* * * * *